United States Patent
Kamiyamane

(10) Patent No.: US 6,851,953 B2
(45) Date of Patent: Feb. 8, 2005

(54) CARD-EDGE CONNECTOR AND CARD MEMBER

(75) Inventor: Shin Kamiyamane, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/440,134

(22) Filed: May 19, 2003

(65) Prior Publication Data

US 2003/0216062 A1 Nov. 20, 2003

(30) Foreign Application Priority Data

May 20, 2002 (JP) ........................................ 2002-144014

(51) Int. Cl.⁷ ............................ H01R 12/04; H05K 1/14
(52) U.S. Cl. ............................ 439/59; 439/629; 439/636
(58) Field of Search ................................. 439/637, 634, 439/636, 629, 630, 59, 62, 60

(56) References Cited

U.S. PATENT DOCUMENTS

| 4,687,266 A | 8/1987 | Tanii et al. |
| 4,715,820 A | * 12/1987 | Andrews et al. ............. 439/59 |
| 5,236,372 A | 8/1993 | Yunoki et al. |
| 6,012,928 A | 1/2000 | Lopata et al. |
| 2001/0014546 A1 | 8/2001 | Yasufuku et al. |

FOREIGN PATENT DOCUMENTS

| JP | 7-231153 | 8/1995 |
| WO | WO 01/59887 A1 | 8/2001 |

OTHER PUBLICATIONS

Patent Abstracts of Japan, vol. 1995, No. 11, (Dec. 1995), Abstract only.

* cited by examiner

*Primary Examiner*—Renee Luebke
(74) *Attorney, Agent, or Firm*—Foley & Lardner LLP

(57) ABSTRACT

A card-edge connector of the present invention includes a card member including a circuit board and a plurality of card-edge electrodes arranged on the circuit board. A connector is affixed to a stationary board and includes a plurality of contacts corresponding one-to-one to the card-edge electrodes. The card member further includes an insulation cover covering an area where the card-edge electrodes are arranged and formed with a plurality of slots via which the card-edge electrodes each are partly exposed to the outside. When the card member is inserted into the connector, the card-edge electrodes and contacts are electrically connected to each other.

15 Claims, 11 Drawing Sheets

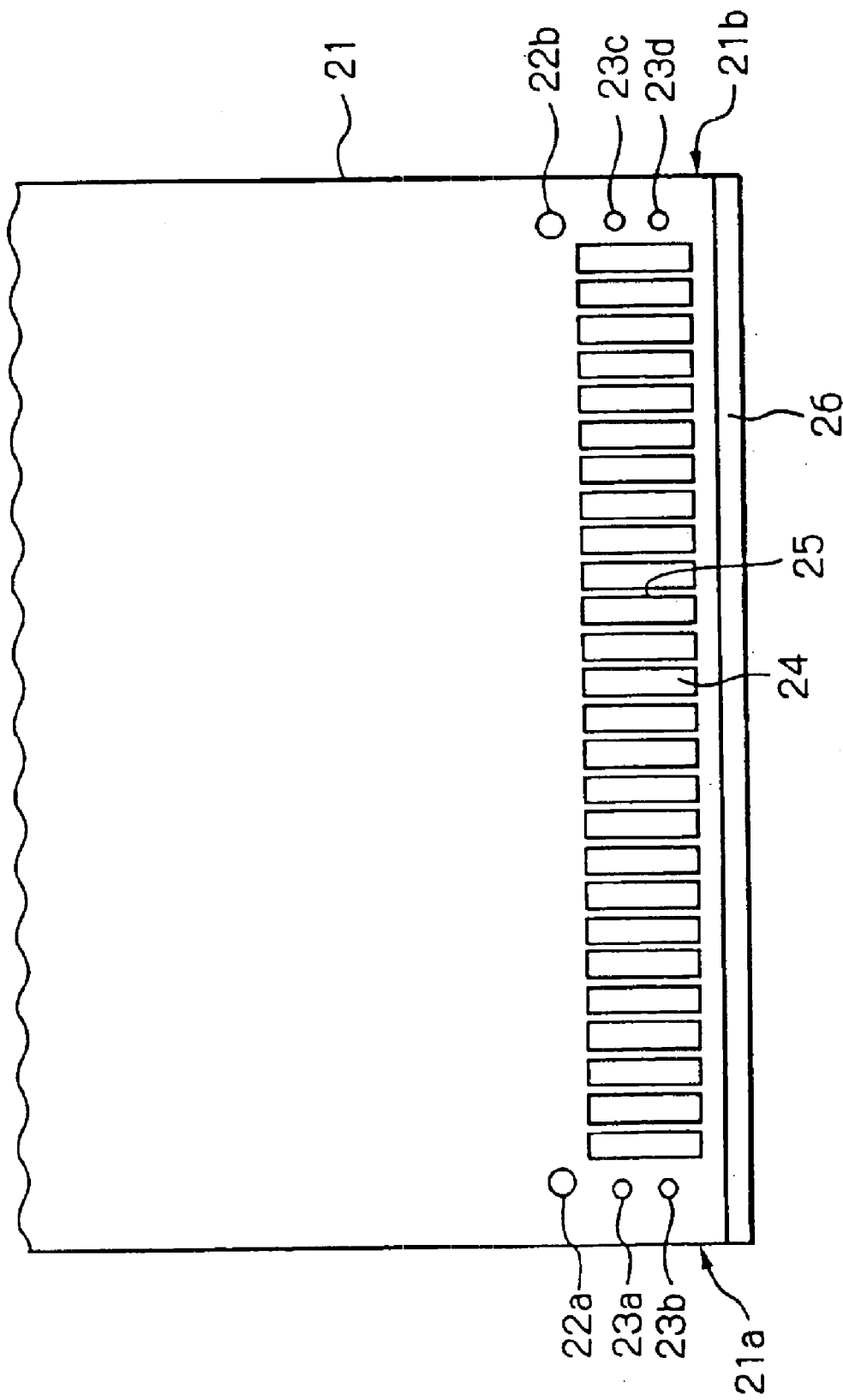

Fig. 6
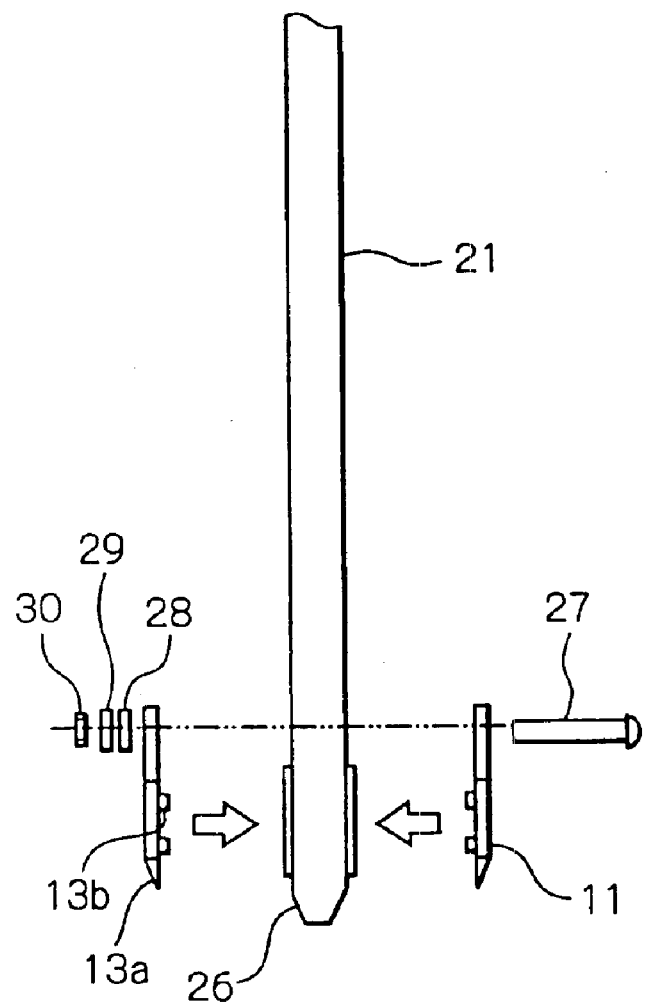
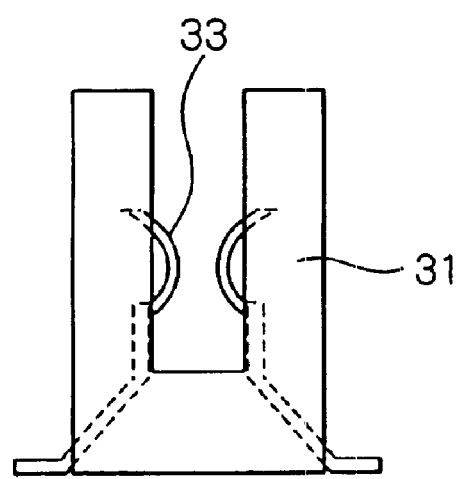

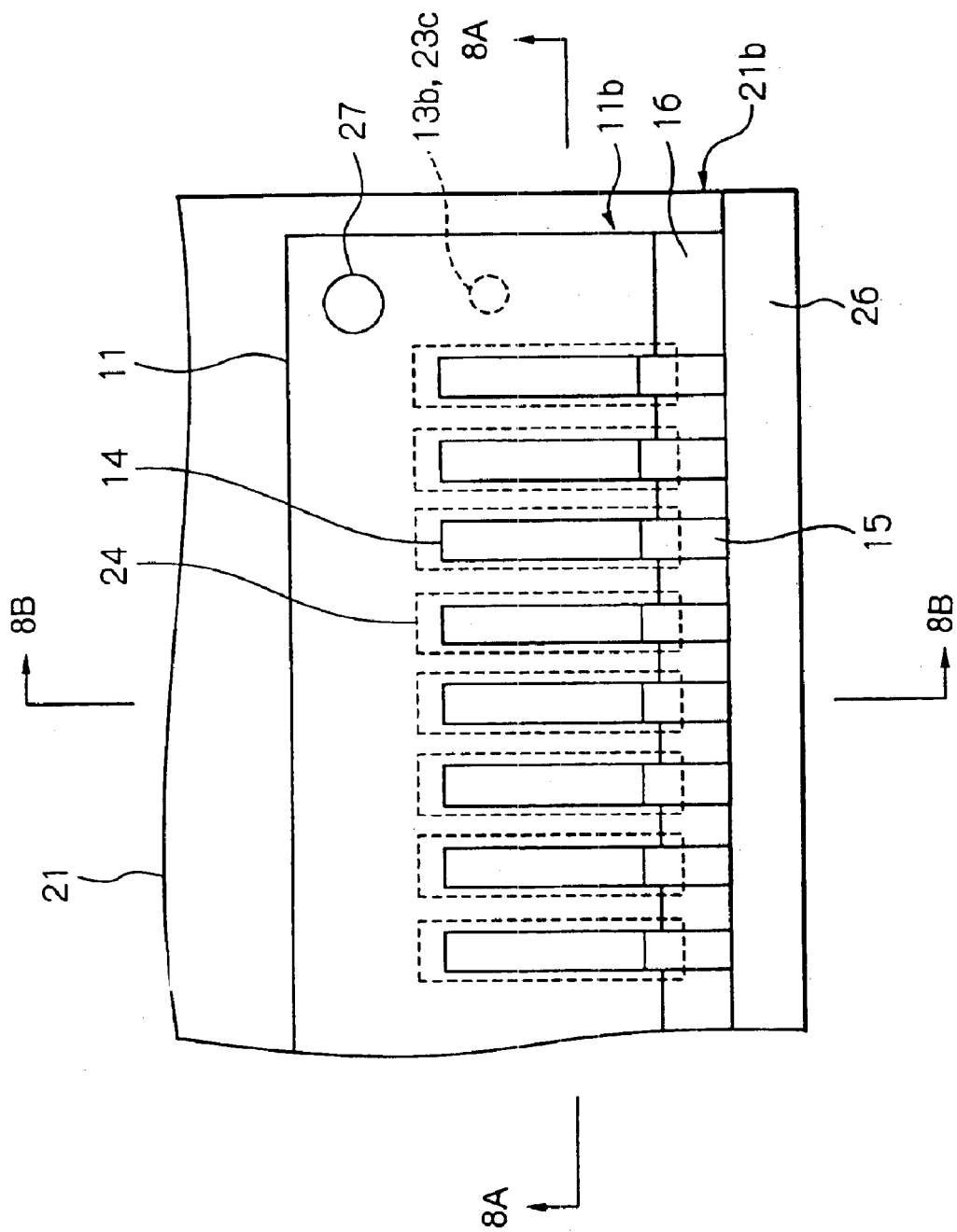

Fig. 9A
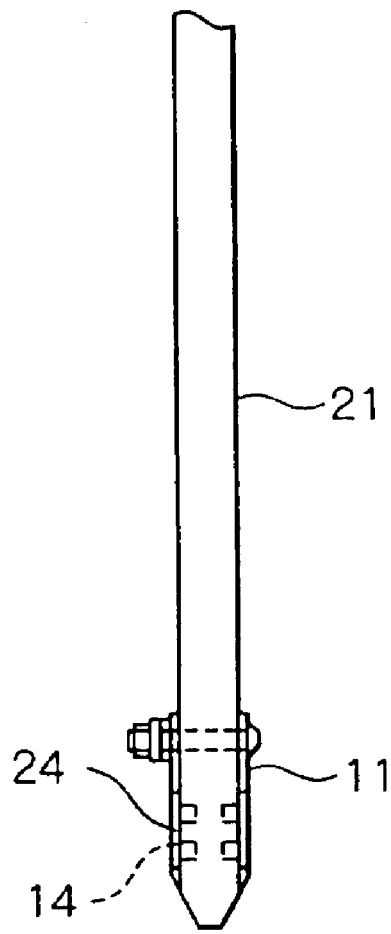
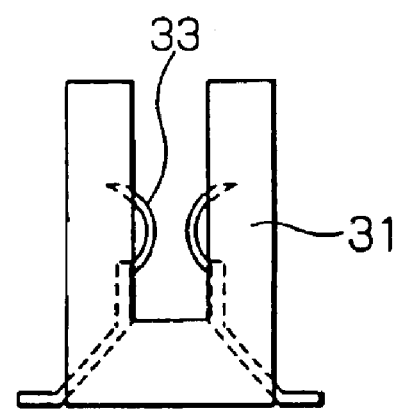
Fig. 9B
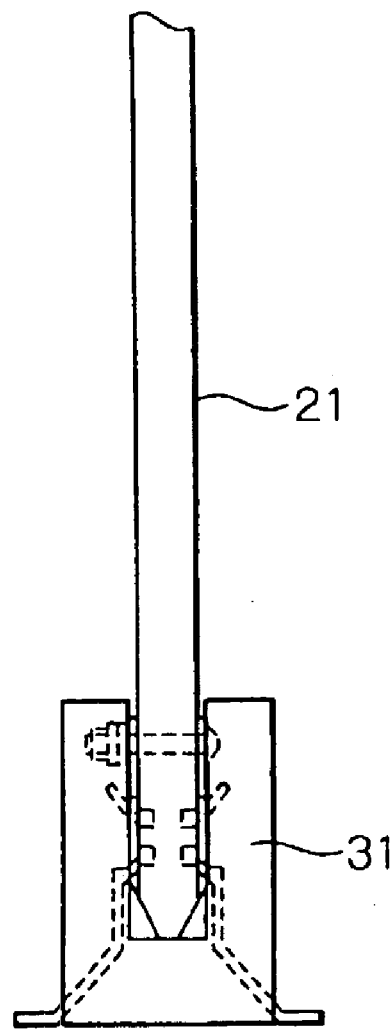

CARD-EDGE CONNECTOR AND CARD MEMBER

BACKGROUND OF THE INVENTION

1. Field of the Invention

The present invention relates to a card-edge connector and a card member for an electronic apparatus and more particularly to a card-edge connector and a card member allowing a minimum of defective contact to occur and allowing a minimum of impurities to deposit on the contact points of contacts.

2. Description of the Background Art

A conventional card-edge connector applicable to various electronic apparatuses is generally made up of a card member with a printed circuit board and a connector affixed to a board, which is included in an electronic apparatus. The card member includes a circuit board, a plurality of card-edge electrodes arranged on the circuit board, and solder resist surrounding the card-edge electrodes. The connector includes a housing for receiving the card member and contacts corresponding one-to-one to the card-edge electrodes.

The conventional card-edge connector described above is superior in electric characteristic to, e.g., a two-piece connector because the card member, which plays the role of one connector, does not have any contact and is relatively short as a contact.

Today, to meet the increasing demand for the dense arrangement of card-edge electrodes, a distance between nearby card-edge electrodes as small as 1 mm or below, e.g., 0.5 mm is required. In this respect, the above conventional card-edge connector has the following problems left unsolved. When the card member is shifted or inclined when inserted into the connector, the contact points of the contacts are shifted from the card-edge electrodes, failing to establish electrical, connection. Further, the card-edge electrodes cannot be extended to the edge of the circuit board for production reasons. In this condition, when the card member is inserted into the connector, the contact points of the contacts rub the surface of the circuit board or the solder resist. As a result, impurities are apt to deposit on the contact points of the contacts.

Technologies relating to the present invention are disclosed in, e.g., Japanese Patent Laid-Open Publication No. 7-231153.

A conventional card-edge connector is shown in FIGS. 1A and 1B. As shown, the card-edge connector is made up of a card member 40A and a connector 40B provided on a board, which is affixed to, e.g., an electronic apparatus not shown. The card member 40A includes a printed circuit, not shown, and an electrode portion 40C that adjoins one edge of the card member 40A. The electrode portion 40C includes a plurality of card-edge electrodes 42 formed on a circuit board 41. Solder resist 43 surrounds the card-edge electrodes 42. The edge of the circuit board 41, adjoining the electrode portion 40C, is formed with a taper 46. The card-edge electrodes 42, solder resist 43 and taper 46 are formed on both sides of the circuit board 41.

The connector 40B on the board side includes a housing 44 for receiving the card member 40A and contacts 45 corresponding one-to-one to the card-edge electrodes 42. The housing 44 is formed with guides 44a and 44b for guiding opposite side edges 41A and 41b of the card member 40A when the card member 40A is inserted into the housing 44.

When the card member 40A is inserted into the connector 40B, the guides 44a and 44b guide the side edges 41a and 41b of the card member 40A until the electrode portion 40C has been electrically connected to the connector 40B. As shown in FIGS. 2A and 2B, in the engaged condition, the contact points of the contacts 45 of the connector 40B get on the card-edge electrodes 42 of the card member 40A to thereby establish electrical connection.

The conventional card-edge connector 40 described above has the following problems when consideration is given to the current trend toward the dense arrangement of card-edge electrodes, e.g., a distance between card-edge electrodes as small as 1 mm or less, e.g., 0.5 mm.

First, as shown in FIG. 1A, when the card member 40A is inserted into the connector 40B, it is likely that the card member 40 is shifted or inclined because the side edges 41a and 41b of the card member 40A lack dimensional accuracy. As a result, the contact points of the contacts 45, FIG. 2B, are shifted from the card-edge electrodes 42 and caused to get on the solder resist 43 or the surface of the circuit board 41, failing to establish electrical connection. Further, assume that the card-edge electrodes 42 are densely arranged in the electrode portion 40C at a small pitch. Then, even if the card member 40A is inserted into the connector 40B in an accurate position, the card-edge electrodes 42 and contacts 45 are shifted from each other little by little as a distance from a reference position increases although they may be accurately aligned at the reference position. The contacts noticeably shifted from the card-edge electrodes 42 would miss the card-edge electrodes 42 and would thereby bring about defective contact.

Second, the card-edge electrodes 42 cannot be extended to the edge of the circuit board 41 for production reasons. In this condition, when the card member 40A is inserted into the connector 40B, the contact points of the contacts 45 rub the surface of the circuit board 41 or the solder resist 43. As a result, impurities are apt to deposit on the contact points of the contacts 45.

SUMMARY OF THE INVENTION

It is an object of the present invention to provide a card edge connector allowing a minimum of defective contact to occur and allowing a minimum of impurities to deposit on the contact points of contacts.

A card-edge connector of the present invention includes a card member including a circuit board and a plurality of card-edge electrodes arranged on the circuit board. A connector is affixed to a stationary board and includes a plurality of contacts corresponding one-to-one to the card-edge electrodes. The card member further includes an insulation cover covering an area where the card-edge electrodes are arranged and formed with a plurality of slots via which the card-edge electrodes each are partly exposed to the outside. When the card member is inserted into the connector, the card-edge electrodes and contacts are electrically connected to each other.

BRIEF DESCRIPTION OF THE DRAWINGS

The above and other objects, features and advantages of the present invention will become more apparent from the following detailed description taken with the accompanying drawings in which:

FIG. 4 is a plan view showing a circuit board;

FIG. 6 is a side elevation showing how the insulation cover of the illustrative embodiment is mounted to a circuit board;

FIG. 7 is a fragmentary view showing part of a card member included in the illustrative embodiment in an enlarged scale;

FIG. 9A is a side elevation showing the electrode portion of the card member and a connector, which is affixed to a boards in a condition before insertion;

FIG. 9B is a view similar to FIG. 9A, showing the electrode portion and connector in a condition after insertion;

DESCRIPTION OF THE PREFERRED EMBODIMENTS

Figure 1B:
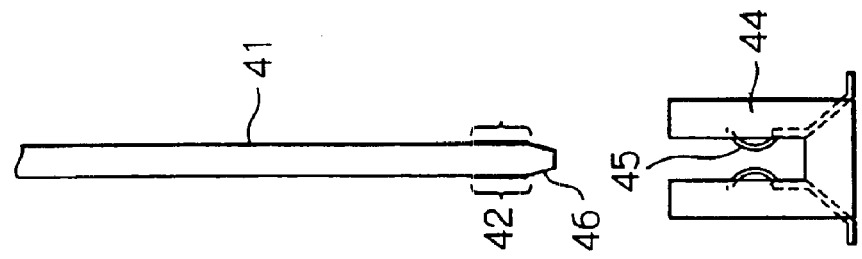
FIGS. 1A and 1B are respectively a plan view and a side elevation showing a specific configuration of a conventional card-edge connector.
Figure 1A:
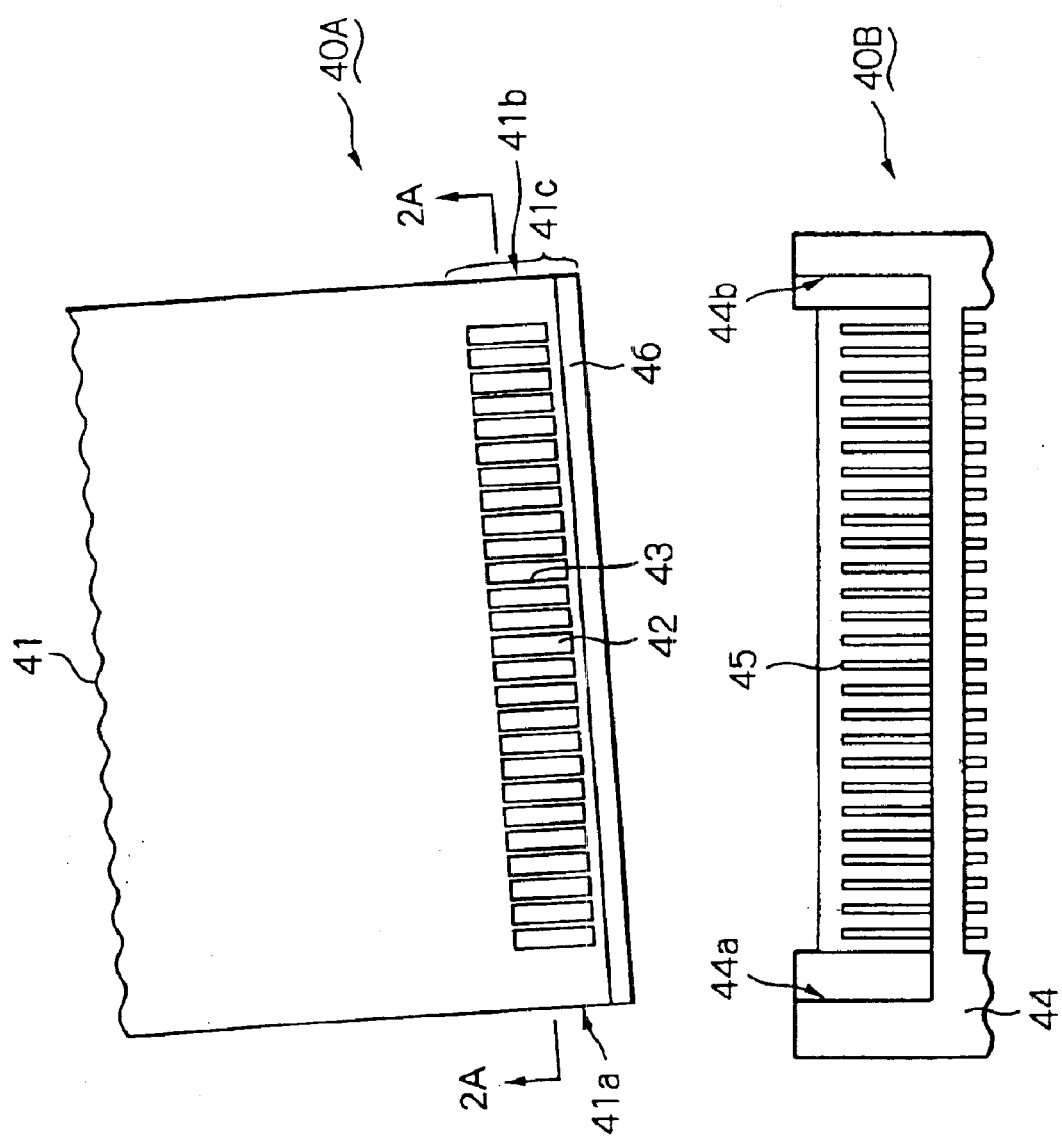
Figure 2A:
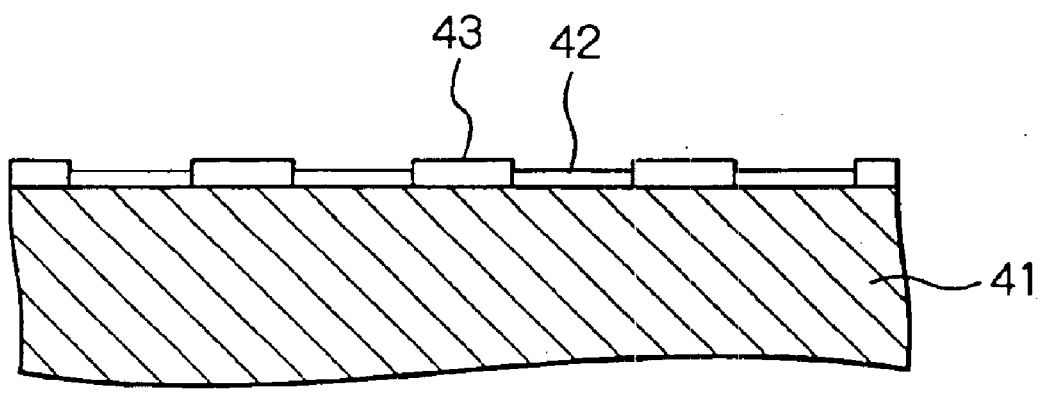
FIG. 2A is a section along line 2A—2A of FIG. 1A.
Figure 2B:
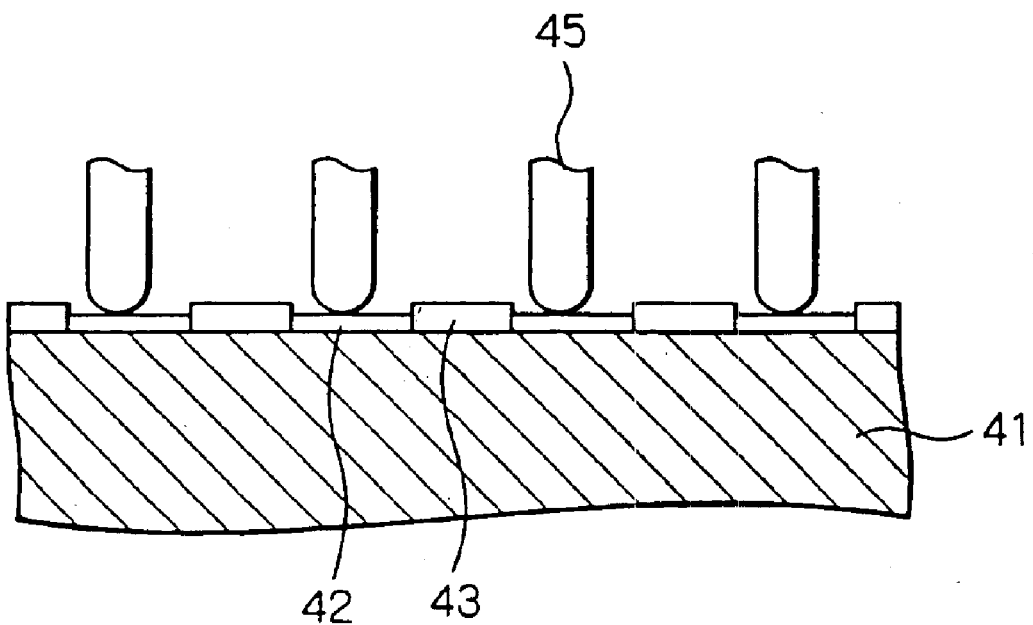
FIG. 2B is a section showing a condition wherein contacts are brought into contact with the electrode portion of a card member shown in FIG. 2A.
Figure 3:
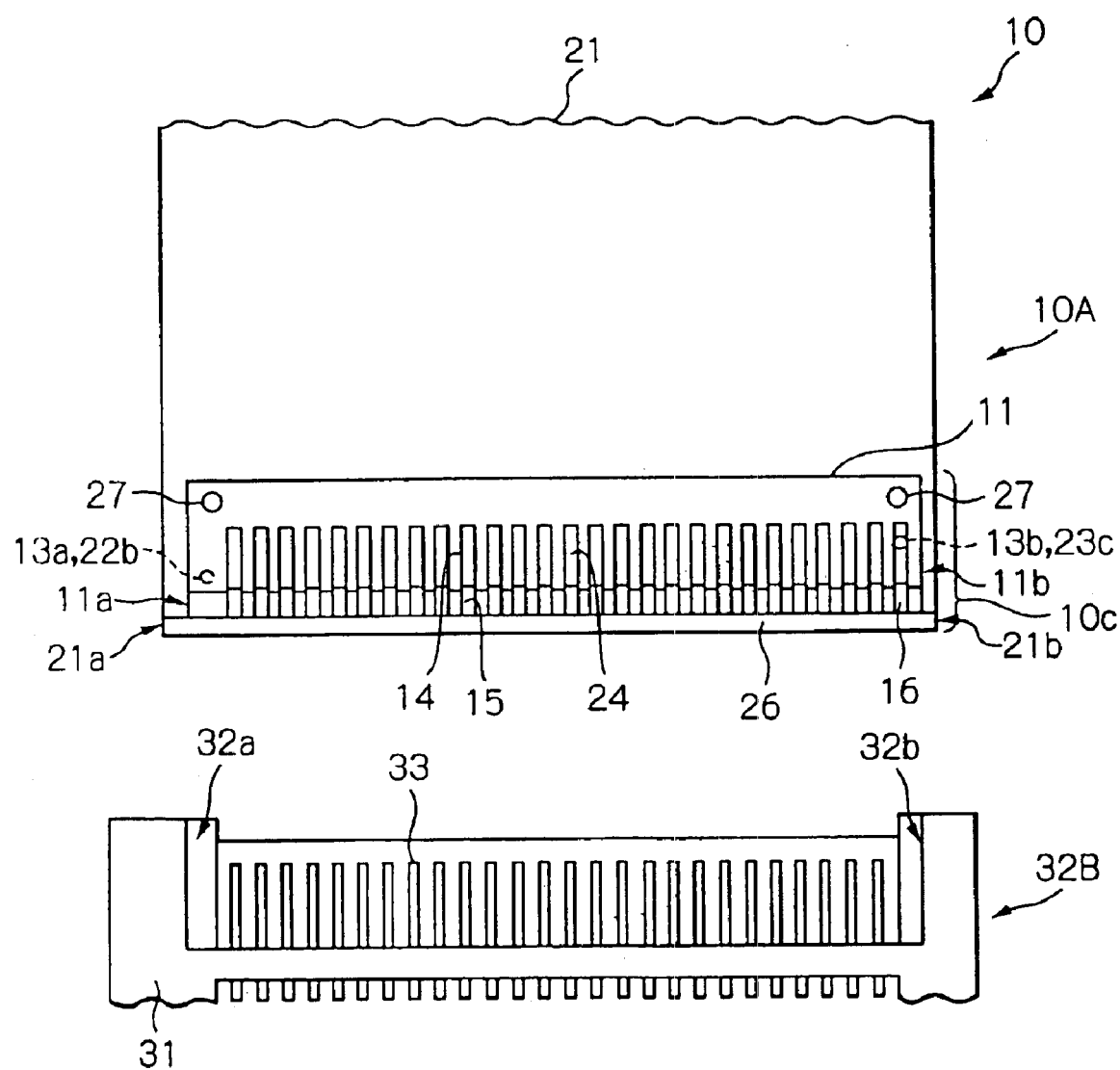
FIG. 3 is a plan view showing a card-edge connector embodying the present invention.

Referring to FIG. 3, a card-edge connector embodying the present invention is shown and generally designated by the reference numeral 10. As shown, the card-edge connector 10 is made up of a card member 10A and a connector 32B provided on a board, which is affixed to, e.g., an electronic apparatus not shown, the card member 10A includes a printed circuit, not shown, and an electrode portion 10C that adjoins one edge of the card member 10A. An insulation cover 11 is affixed to a circuit board 21 included in the card member 10A.

As shown in FIG. 4, a plurality of card-edge electrodes 24 are arranged in the electrode portion 10C of the circuit board 21 and surrounded by solder resist 25. The edge of the circuit board 21 is formed with a taper 26. The circuit board 21 is formed with holes 22a and 22b for affixing the insulation cover 11 and holes 23a, 23b, 23c and 23d for positioning the insulation cover 11. The card-edge electrodes 24 and taper 26 are formed on both sides of the circuit board 21.

Figure 5A:
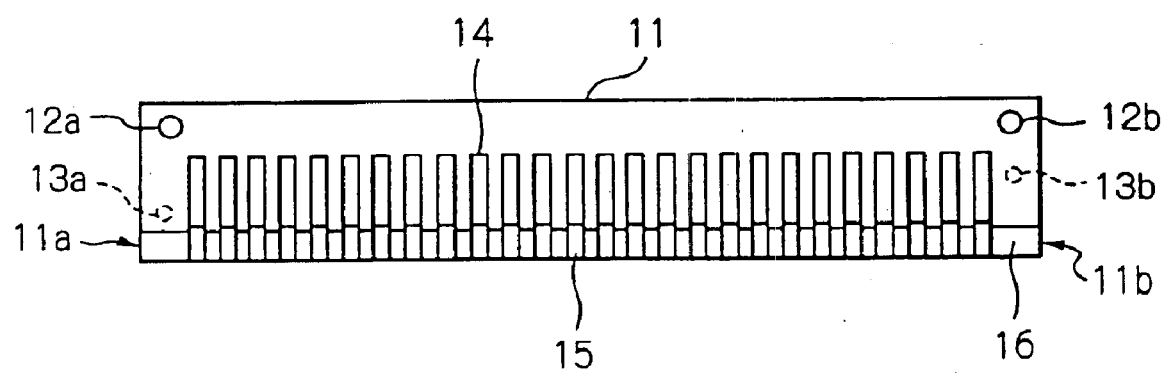
FIGS. 5A, 5B and 5C are respectively a plan view, a front view and a side elevation showing an insulation cover included in the illustrative embodiment.
Figure 5B:
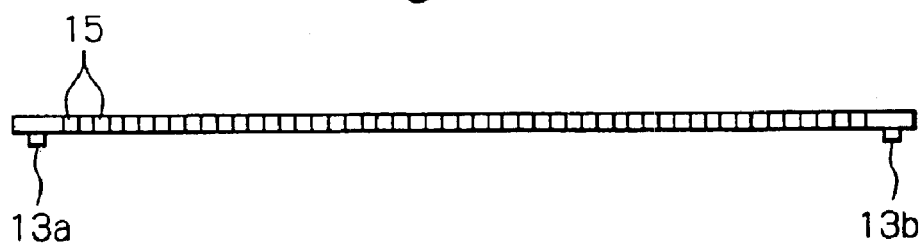
Figure 5C:
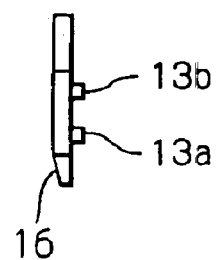

As shown in FIGS. 5A through 5C in detail, the insulation cover 11 is formed of an insulator and configured to cover the entire area where the card-edge electrodes 24 are arranged. The insulation cover 11 is formed with slots 14 corresponding one-to-one to the card-edge electrodes 24. The slots 14 each are sized (area) smaller than the corresponding card-edge electrode 24, so that only part of the card-edge electrode 24 is exposed to the outside.

The insulation cover 11 is formed with holes 12a and 12b that allow the cover 11 to be affixed to the circuit board 21 and lugs 13a and 13b that allow the former to be positioned relative to the latter. Opposite side edges 11a and 11b of the insulation cover 11 are so configured as to be parallel to the side edges 21a and 21b of the circuit board 21 when mounted to the circuit board 21 in the direction of insertion. In addition, the side edges 11a and 11b are provided with higher dimensional accuracy than the side edges 21a and 21b.

Further, a square metal pad 15 is positioned on the insertion side of each slot 14 at a position where the corresponding contact of the connector 10B slides in the initial stage of insertion. The metal pad 15 may be press-fitted or adhered to the cover 11. A taper 16 is also formed on the insertion side of the cover and metal pad 15. The insulation cover 11 is formed of an insulator except for the metal pads 15.

As shown in FIG. 6, to mount the insulation cover 11 to the circuit board 21, two insulation covers 11 are put on opposite major surfaces of the circuit board 21. Subsequently, the lugs 13a and 13b of one of the insulation covers 11 are caused to mate with the holes 23b and 23c of the circuit board 21, positioning the insulation cover 11 relative to the circuit board 21. Likewise, the other insulation cover 11 is positioned relative to the circuit board 21 with its lugs 13a and 13b mating with the holes 23a and 23d of the circuit board 21.

Thereafter, screws 27 (only one is shown) are passed through the holes 12a and 12b of the insulation covers 11 and the holes 22a and 22b of the circuit board 21 aligned with each other. Finally, the insulation covers 11 are affixed to the circuit board 21 by use of washers 28, spring washers 29, and nuts 30, thereby completing the card member 10A.

If desired, the screws 27 may be replaced with tapping screws for directly affixing the insulation covers 11 to the circuit board 21, in which case the hole 12a will be provided with a larger diameter than the hole 12b and a single tapping screw will be positioned on each side of the circuit board 21. This scheme makes the washers 28, spring washers 29 and nuts 30 unnecessary. Further, the insulation covers 11 may be adhered or otherwise fitted on the circuit board 21. In any case, the configuration of each insulation cover 11 does not have to be varied without regard to the affixing method.

Figure 8A:
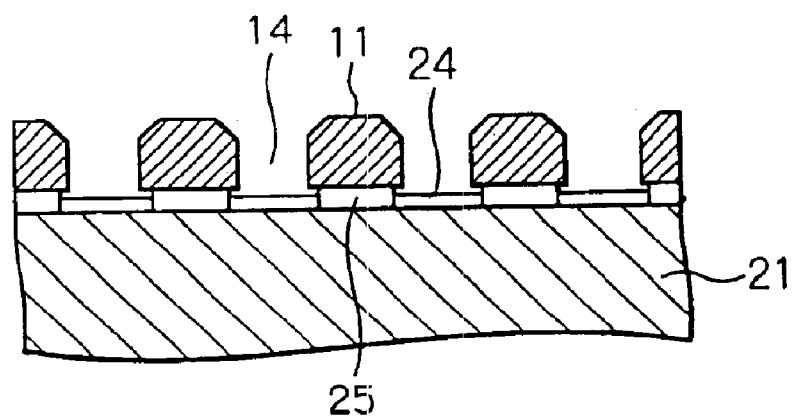
FIG. 8A is a section along line 8A—8A of FIG. 7.
Figure 8B:
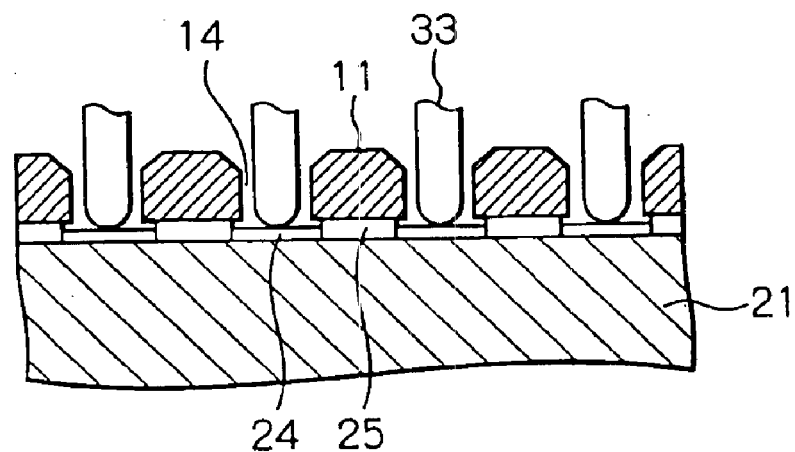
FIG. 8B is a section showing a condition wherein contacts are held in a contact position in the condition of FIG. 8A.
Figure 8C:
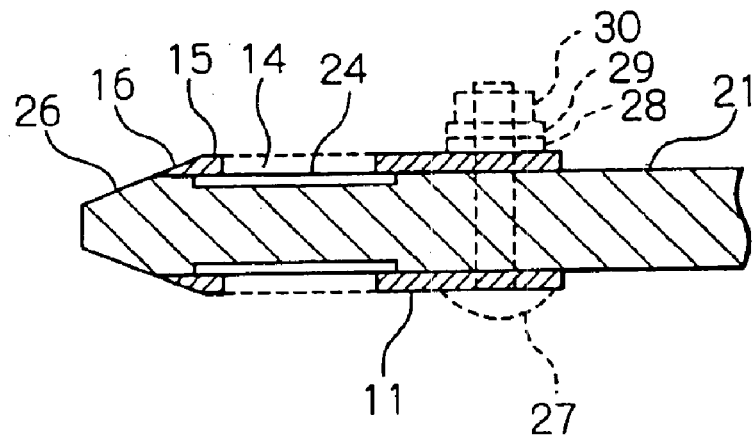
FIG. 8C is a section along line 8A—8A of FIG. 7.

FIG. 7 shows part of the card member 10A in an enlarged view. FIGS. 8A and 8C are sections along lines 8A—8A and 8B—8B of FIG. 7, respectively. FIG. 8B is also a section along line 8A—8A of FIG. 7, but showing an inserted condition. As shown in FIG. 7, 8A and 8C, when each insulation cover 11 is affixed to the circuit board 21, only the card-edge electrodes 24 are exposed to the outside via the slots 14 while the solder resist 25 are on the surface of the circuit board 21 hidden below the insulation cover 11.

As shown in FIG. 3, the connector 10B on the board side includes a housing 31 for receiving the card member 10A and contacts 33 corresponding one-to-one to the card-edge electrodes 24. The housing 31 is formed with guides 32a and 32b for guiding opposite side edges 11a and 11b of the insulation cover 11 when the card member 10A is inserted into the housing 31.

FIGS. 9A and 9B respectively show a condition before the card member 10A is inserted into the connector 10B and a condition after the former has been inserted into the latter. As shown, when the card member 10A is inserted into the connector 10B, the contacts 33 each mate with one of the slots 14. As shown in FIG. 9B, in the inserted condition, the contact point of each contact 33 gets on the corresponding card-edge electrode 24 exposed via the slot 14, establishing electrical connection. In this condition, the contact point of the contact 33 is movable only in the range delimited by the edges of the slot 14 and therefore does not easily slip out of the card-edge electrode 24.

Figure 10A:
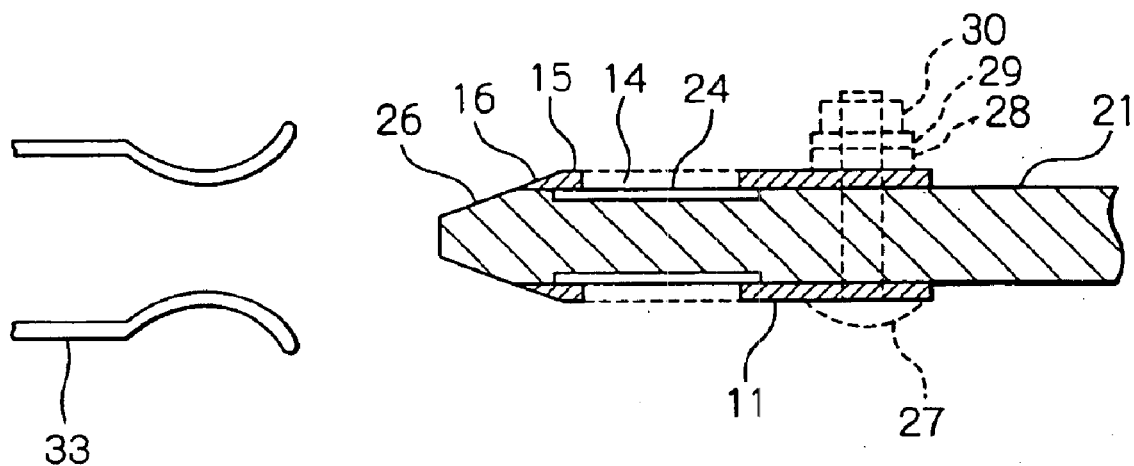
FIG. 10A is a section showing a condition wherein the electrode portion of the card member is spaced from the contacts of the connector.

How the card member 10A is inserted into the connector 10B will be described more specifically hereinafter. At a first stage, when the card member 10A is inserted into the connector 10B, the former advances into the latter straight-forward with its edges 11a and 11b being guided by the guides 32a and 32b, i.e., with the circuit board 21 being positioned parallel to the direction of insertion. FIG. 10A shows the leading edge portion of the card member 10A and contacts 33 in the first stage. The contacts 33 then get on the associated metal pads 15 while being guided by the tapers 26 and 16.

Figure 10B:
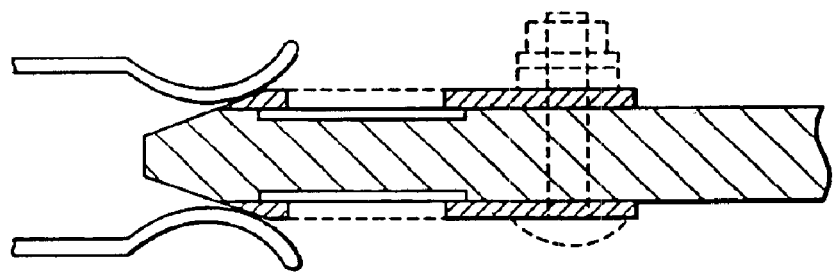
FIG. 10B is a view similar to FIG. 10A, showing the electrode portion started to contact the contacts of the connector.

As shown in FIG. 10B, at a second stage following the first stage, the contact point of each contact 33 moves on the surface of the associated metal pad 15 while rubbing the metal pad 15. At this instant, a wiping effect occurs on the contact point of the contact 33 and removes oxide or oxide films and impurities from the contact point. Further, because the edge portions of each card-edge electrode 24 and portion around them are covered with the insulation cover 11, the contact 33 does not rub the surface of the circuit board 21 or the solder resist 25, obviating the deposition of impurities.

Figure 10C:
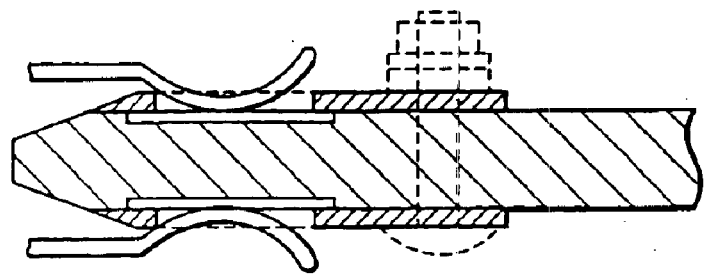
FIG. 10C is a view also similar to FIG. 10A, showing the electrode portion fully contacted the contacts of the connector.

As shown in FIG. 10C, at a third stage following the second stage, the contact 33 slips into the slot 14 and contacts the card-edge electrode 24. In this condition, the contact point of the contact 33 is movable only in the range delimited by the edges of the slot 14 and therefore does not easily slip out of the card-edge electrode 24, as stated earlier. Even if the dimensional accuracy of the boundary between nearby card-edge electrodes 24 is relatively low, the card-edge electrode 24 and the contact point of the contact 33 can accurately contact each other because the above boundary is hidden below the insulation cover 11.

The illustrative embodiment described above has the various unprecedented advantages, as enumerated below.

(1) Each insulation cover 11 covers the region where the card-edge electrodes 24 are arranged while allowing only part of each electrode 24 to appear via the associated slot 14. Therefore, in the inserted condition, the contact point of each contact 33 is movable only in the range delimited by the edges of the slot 14 and therefore does not easily slip out of the card-edge electrode 24, obviating defective contact. The card-edge connector 10 is therefore highly reliable.

(2) The insulation covers 11 are positioned by the holes 23a through 23d and lugs 13a and 13b while the edges with high positional accuracy are respectively guided by the guides 32a and 32b during insertion. This prevents the circuit board 21 from being dislocated or inclined for thereby obviating defective contact.

(3) Even when the circuit board 21 is inclined or when the contacts 33 are not accurately arranged, the contacts 33 can be guided onto the card-edge electrodes 24 for the same reasons as stated above in (2) and (3). For the same reasons, a number of electrodes can be densely arranged in the card-edge connector 10 at a small pitch.

(4) The boundary between nearby card-edge electrodes 24 is hidden below the insulation cover 11. This, coupled with the reason stated in (2), high reliability is achievable with the circuit board 21 even if the side edges 21a and 21b and the boundary between nearby card-edge electrodes lack dimensional accuracy. More specifically, the allowance of the side edges 21a and 21b or that of the above boundary do not effect contact.

(5) The metal pads 15 each are located at a position where the corresponding contact 33 slides at the initial stage of insertion, and therefore wipe the contact 33. For the same reason, when the card member 10A is inserted into the connector 10B, the contact 33 does not rub the surface of the circuit board 21 or the solder resist 25 and is therefore free from the deposition of impurities.

The insulation covers 11 should preferably be produced by molding by use of resin containing insulative glass, e.g., PBT (polybuthylene terephthalate), LCP (Liquid Crystal Polymer) containing glass. Further, the insulation covers 11 should preferably be formed of the same material as the housing 31 of the connector 10B in order to reduce friction and shave-off during insertion.

The metal pads 15 should preferably be formed of copper. Also, to protect the surfaces of the metal pads from oxidation and because the contacts 33 of the connector 106 are generally plated with gold, it is preferable to form a 1.27 $\mu$m to 2 $\mu$m thick, nickel under layer on copper mentioned above and then apply hard gold plating to the under layer to thickness of 0.8 $\mu$m or above.

Figure 11:
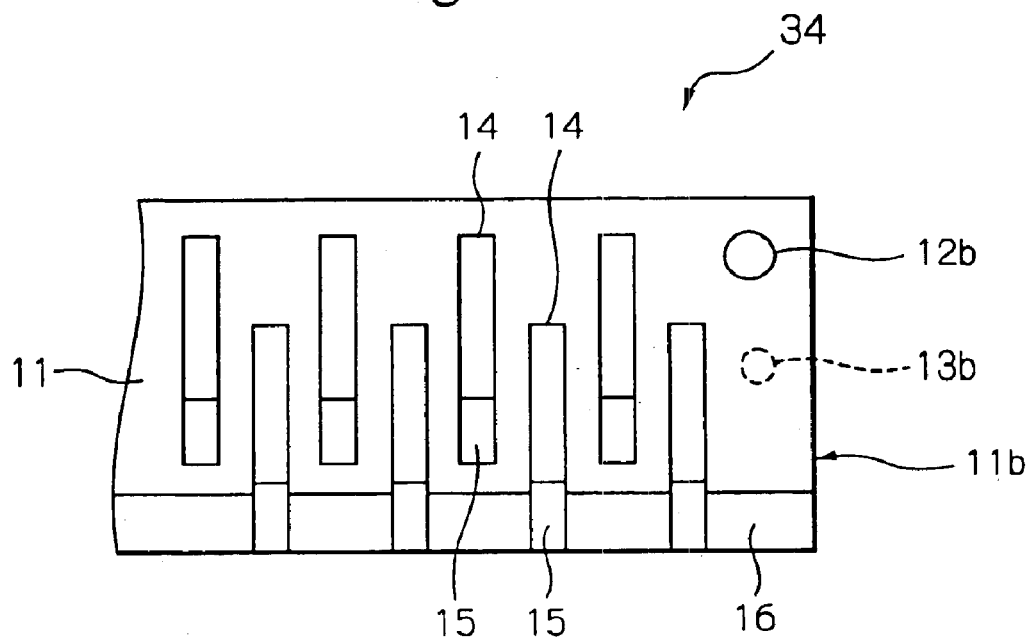
FIG. 11 is a plan view showing an alternative embodiment of the present invention.

FIG. 11 shows an alternative embodiment of the present invention. In FIG. 11, structural elements identical with the structural elements in FIG. 5A are designated by identical reference numerals and will not be described specifically in order to avoid redundancy. As shown, a card-edge connector, generally 34, differs from the card-edge connector 10 in that the contacts 33 of the connector 10B, the card-edge electrodes 24 of the circuit board 21 and the slots 14 and metal pads 15 of the insulation cover 11 are arranged in a zigzag pattern. With this configuration, the illustrative embodiment further enhances the dense arrangement of the card-edge connector while achieving the same advantages as the previous embodiment. More specifically, the zigzag pattern stated above realizes denser arrangement for thereby extending the applicability of the card-edge connector.

Figure 12:
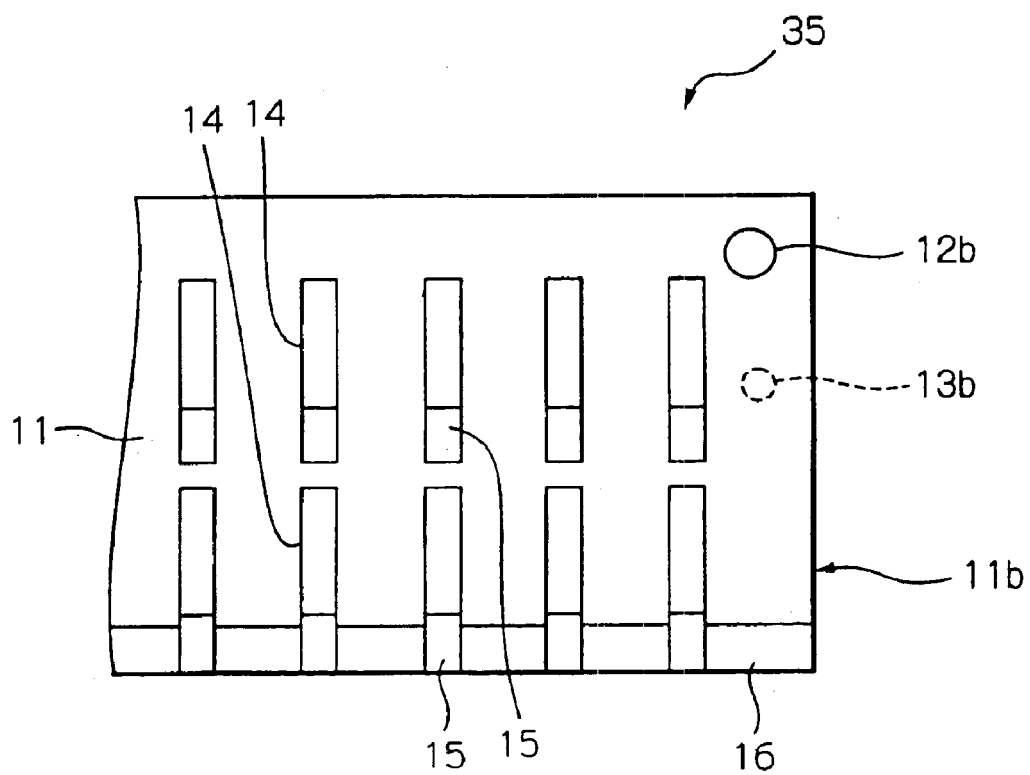
FIG. 12 is a plan view showing another alternative embodiment of the present invention.

FIG. 12 shows another alternative embodiment of the present invention. In FIG. 12, structural elements identical with the structural elements in FIG. 5A are designated by identical reference numerals and will not be described specifically in order to avoid redundancy. As shown, a card-edge connector, generally 35, differs from the card-edge connector 10 in that the contacts 33 of the connector 10B, the card-edge electrodes 24 of the circuit board 21 and the slots 14 and metal pads 15 of the insulation cover 11 are arranged in two parallel arrays. With this configuration, the illustrative embodiment also further enhances the dense arrangement of the card-edge connector while achieving the same advantages as the embodiment of FIG. 3. Of course, the electrodes, slots and so forth may be arranged in three or more arrays for implementing further denser, diverse configurations.

It is to be noted that the card-edge connector of the present invention is applicable to, e.g., an electronic circuit board included in an electronic apparatus or a computer. The card member of the card-edge connector may be implemented as the expanded memory of a personal computer by way of example.

Various modifications will become possible for those skilled in the art after receiving the teachings of the present disclosure without departing from the scope thereof.

What is claimed is:

1. A card-edge connector comprising;

a card member comprising a circuit board and a plurality of card-edge electrodes arranged on said circuit board; and a connector affixed to a stationary board and comprising a plurality of contacts corresponding one-to-one to said card-edge electrodes;

said card member further comprising an insulation cover covering an area where said card-edge electrodes are arranged and formed with a plurality of slots via which said plurality of card-edge electrodes each are partly exposed to the outside;

wherein when said card member is inserted into said connector, said card-edge electrodes and said contacts are electrically connected to each other, said insulation cover comprising a plurality of metal pads on which a corresponding one of said contacts slides in an initial stage of operation in which said card member is inserted into said connector.

2. The connector as claimed in claim 1, wherein said insulation cover covers edges of said card-edge electrodes and portions around said edges.

3. The connector as claimed in claim 2, wherein said insulation cover is affixed to said circuit board by either one of screwing and adhesion.

4. The connector as claimed in claim 1, wherein said insulation cover is affixed to said circuit board by either one of screwing and adhesion.

5. The connector as claimed in claim 1, wherein said connector further comprises guides for guiding opposite edges of said insulation cover when said card member is inserted into said connector.

6. A card-edge connector comprising:

a card member comprising a circuit board and a plurality of card-edge electrodes arranged on said circuit board; and a connector affixed to a stationary board and comprising a plurality of contacts corresponding one-to-one to said card-edge electrodes;

said card member further comprising an insulation cover covering an area where said card-edge electrodes are arranged and formed with a plurality of slots via which said plurality of card-edge electrodes each are partly exposed to the outside, wherein when said card member is inserted into said connector, said card-edge electrodes and said contacts are electrically connected to each other, wherein said insulation cover covers edges of said card-edge electrodes and portions around said edges, wherein said insulation cover is affixed to said circuit board by either one of screwing and adhesion, and wherein said circuit board and said insulation cover comprise mating members at corresponding portions thereof and are positioned relative to each other by said mating members.

7. The connector as claimed in claim 6, wherein said connector further comprises guides for guiding opposite edges of said insulation cover when said card member is inserted into said connector.

8. The connector as claimed in claim 7, wherein said insulation cover comprises a plurality of metal pads on each of which one of said contacts slides in an initial stage of insertion.

9. A card-edge connector comprising:

a card member comprising a circuit board and a plurality of card-edge electrodes arranged on said circuit board; and a connector affixed to a stationary board and comprising a plurality of contacts corresponding one-to-one to said card-edge electrodes;

said card member further comprising an insulation cover covering an area where said card-edge electrodes are arranged and formed with a plurality of slots via which said plurality of card-edge electrodes each are partly exposed to the outside;

wherein when said card member is inserted into said connector, said card-edge electrodes and said contacts are electrically connected to each other, wherein said insulation cover is affixed to said circuit board by either one of screwing and adhesion, and wherein said circuit board and said insulation cover comprise mating members at corresponding portions thereof and are positioned relative to each other by said mating members.

10. The connector as claimed in claim 9, wherein said connector further comprises guides for guiding opposite edges of said insulation cover when said card member is inserted into said connector.

11. The connector as claimed in claim 10, wherein said insulation cover comprises a plurality of metal pads on each of which one of said contacts slides in an initial stage of insertion.

12. A card-edge connector comprising:

a card member comprising a circuit board and a plurality of card-edge electrodes arranged on said circuit board; and a connector affixed to a stationary board and comprising a plurality of contacts corresponding one-to-one to said card-edge electrodes;

said card member further comprising an insulation cover covering an area where said card-edge electrodes are arranged and formed with a plurality of slots via which said plurality of card-edge electrodes each are partly exposed to the outside;

wherein when said card member is inserted into said connector, said card-edge electrodes and said contacts are electrically connected to each other, wherein said circuit board and said insulation cover comprise mating members at corresponding portions thereof and are positioned relative to each other by said mating members.

13. The connector as claimed in claim 12, wherein said connector further comprises guides for guiding apposite edges of said insulation cover when said card member is inserted into said connector.

14. The connector as claimed in claim 12, wherein said insulation cover comprises a plurality of metal pads on each of which one of said contacts slides in an initial stage of insertion.

15. A card-edge connector comprising:

a card member comprising a circuit board and a plurality of card-edge electrodes arranged on said circuit board; and a connector affixed to a stationary board and comprising a plurality of contacts corresponding one-to-one to said card-edge electrodes;

said card member further comprising an insulation cover covering an area where said card-edge electrodes are arranged and formed with a plurality of slots via which said plurality of card-edge electrodes each are partly exposed to the outside;

wherein when said card member is inserted into said connector, said card-edge electrodes and said contacts are electrically connected to each other, wherein said connector further comprises guides for guiding opposite edges of said insulation cover when said card member is inserted into said connector, and wherein said insulation cover comprises a plurality of metal pads on each of which one of said contacts slides in an initial stage of insertion.

* * * * *